(12) United States Patent
Huang et al.

(10) Patent No.: US 9,891,533 B2
(45) Date of Patent: Feb. 13, 2018

(54) CONJUGATE COMMON OPTICAL PATH LITHOGRAPHY LENS

(71) Applicant: National Applied Research Laboratories, Taipei (TW)

(72) Inventors: Jiun-Woei Huang, Taipei (TW); Shih-Feng Tseng, Hsinchu County (TW); Jer-Liang Yeh, Hsinchu County (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 35 days.

(21) Appl. No.: 14/740,445

(22) Filed: Jun. 16, 2015

(65) Prior Publication Data

US 2016/0370564 A1    Dec. 22, 2016

(51) Int. Cl.
| | |
|---|---|
| *G02B 17/00* | (2006.01) |
| *G03F 7/20* | (2006.01) |
| *G02B 13/22* | (2006.01) |
| *G02B 17/08* | (2006.01) |
| *G02B 13/18* | (2006.01) |

(52) U.S. Cl.
CPC ............ *G03F 7/7015* (2013.01); *G02B 13/18* (2013.01); *G02B 13/22* (2013.01); *G02B 17/08* (2013.01); *G03F 7/70225* (2013.01)

(58) Field of Classification Search
CPC .................................................. G02B 17/0832
USPC ........................................................ 359/726
See application file for complete search history.

(56) References Cited

U.S. PATENT DOCUMENTS

| | | | | |
|---|---|---|---|---|
| 2008/0117532 | A1* | 5/2008 | Shafer ................. | G03F 7/70225 359/727 |
| 2009/0185290 | A1* | 7/2009 | Li .......................... | G02B 17/08 359/727 |
| 2015/0331326 | A1* | 11/2015 | Zhao .................... | G03F 7/70225 355/67 |

* cited by examiner

*Primary Examiner* — James Jones
(74) *Attorney, Agent, or Firm* — Jackson IPG PLLC; Demian K. Jackson

(57) ABSTRACT

A conjugate common light path lithography lens set includes a first, second, third, and fourth spherical mirrors, arranged sequentially, a spherical reflecting mirror arranged below the fourth spherical mirror, a first and second planar reflecting mirrors, inclinedly arranged above the first spherical mirror, so that a conjugate telecentric component pattern is formed to maintain an pattern of an object to have a non-deformed pattern after experiencing these optical components. As such, the omni-spherical mirror set and two kinds of optical material are mutually arranged to form the novel conjugate common light path lithography lens set. This may further achieve the function of the lithography lens, and have a direct effect on the manufacturing cost. And, the efficacies of reduced component number, easier manufacture of the optical components (satisfied with the lens manufacturing's experience equation), easier calibration, reduced chromatic abberation, optimized aperature F/#, and a reduced cost may be achieved.

9 Claims, 8 Drawing Sheets

CONJUGATE COMMON OPTICAL PATH LITHOGRAPHY LENS

FIELD OF THE INVENTION

A lithography mirror set is an important secondary system for a lithography lens set for manufacture of electronic devices. However, the currently available lithography lens sets are all full refractive lens and long optical extended lens. The former has a large volume. The latter may reduce the number of devices, but it adopts multiple faces and thus involves a difficult manufacture and assembly.

The long optical extended lithography lens set may be seen in the ASML fashion manufactured by a Germany company ZEISS, with the counterpart patents DE9355198 and DE19922209; and in the folded symptotic curvature fashion manufactured by a Japan company NIKON, as shown in FIG. 7.

In addition, to save the used material, a French company Thales Group adopts the DYSON return fashion to reduce a light path, so that the light returns back and forth in the mirror sets 40, 50, also seen in its counterpart Chinese patent CN101171546. Thus, the number of mirrors 40, 50 may be reduced. However, the mirror sets 40, 50 and the reflecting faces 20, 22 have to be non-spherical faces, as shown in FIG. 8. In addition, the lithography lens set proposed by Shanghai Micro-Electromechanical Co., having the counterpart U.S. Pat. No. 7,746,571 B2, also uses the similar fashion, i.e. the long optical extended, to achieve the lithography function. However, the technologies all adopt multiple non-spherical mirrors in the above patents, requiring a difficult manufacture and assembly, which also involves a high precision and thus a high cost. Therefore, the prior art lithography sets still have a requirement for improvement to satisfy a user's actual use.

DESCRIPTION OF THE RELATED ART

A lithography mirror set is an important secondary system for a lithography lens set for manufacture of electronic devices. However, the currently available lithography lens sets are all full refractive lens and long optical extended lens. The former has a large volume. The latter may reduce the number of devices, but it adopts multiple faces and thus involves a difficult manufacture and assembly.

The long optical extended lithography lens set may be seen in the ASML fashion manufactured by a Germany company ZEISS, with the counterpart patents DE9355198 and DE19922209; and in the folded symptotic curvature fashion manufactured by a Japan company NIKON, as shown in FIG. 7.

In addition, to save the used material, a French company Thales Group adopts the DYSON return fashion to reduce a light path, so that the light returns back and forth in the mirror sets 40, 50, also seen in its counterpart Chinese patent CN101171546. Thus, the number of mirrors 40, 50 may be reduced. However, the mirror sets 40, 50 and the reflecting faces 20, 22 have to be non-spherical faces, as shown in FIG. 8. In addition, the lithography lens set proposed by Shanghai Micro-Electromechanical Co., having the counterpart U.S. Pat. No. 7,746,571 B2, also uses the similar fashion, i.e. the long optical extended, to achieve the lithography function. However, the technologies all adopt multiple non-spherical mirrors in the above patents, requiring a difficult manufacture and assembly, which also involves a high precision and thus a high cost. Therefore, the prior art lithography sets still have a requirement for improvement to satisfy a user's actual use.

SUMMARY OF THE INVENTION

It is, therefore, an object of the present invention to overcome the issues encountered in the prior art and set forth a conjugate common light path lithography lens set which adopts a spherical and folded assembly in which each of four spherical lens and reflecting mirrors all have a spherical surface, a omni-spherical mirror set and two kinds of optical material are mutually arranged to form the novel conjugate common light path lithography lens set.

It is a secondary object of the present invention to set forth a conjugate common light path lithography lens set, which may further achieve the function of the lithography lens, and have a direct effect on the manufacturing cost, and further have the efficacies of reduced component number, easier manufacture of the optical components (satisfied with the lens manufacturing's experience equation), easier calibration, reduced chromatic abberation, optimized aperature F/#, and a reduced cost.

According to the present invention, the conjugate common light path lithography lens set, comprising a spherical lens set, comprising a first spherical lens, a second spherical lens, a third spherical lens, and a fourth spherical lens arranged sequentially, the first and second spherical lens providing a curvature and a calibrated planatism, and the third and fourth spherical lens being used to calibrate an astigmatism and a curvature of field; a spherical reflecting mirror, arranged below a fourth spherical lens, to reflect a light path and control a dimension of a numerical aperture; a first and second planar reflecting mirrors, inclinedly arranged above the first spherical lens to guide a light path, so that a conjugate telecentric component pattern is formed by the spherical lens set, the spherical reflecting mirror, and the first and second planar reflecting mirrors so as to maintain an pattern of an object to have a non-deformed pattern after experiencing the spherical lens set, the spherical reflecting mirror, and the first and second planar reflecting mirrors.

In an embodiment, the first, second and third spherical lens are each a positive curvature mirror.

In an embodiment, the fourth spherical lens is a concave lens set and a concaved reflecting mirror.

In an embodiment, the first, second, third, and fourth spherical lenses are arranged in such an order so that a chromatic abberation is calibrated.

In an embodiment, the object is a mask.

In an embodiment, the pattern of the object is outputted after experiencing the first planar reflecting mirror, the first, second, third, fourth spherical lenses, the spherical reflecting mirror, the fourth, third, second and first spherical lenses, and the second planar reflecting mirror.

In an embodiment, the conjugate common light path lithography lens set is applied to collimated image projection device.

BRIEF DESCRIPTIONS OF THE DRAWINGS

The present invention will be better understood from the following detailed descriptions of the preferred embodiments according to the present invention, taken in conjunction with the accompanying drawings, in which.

DESCRIPTION OF THE PREFERRED EMBODIMENTS

Figure 1:
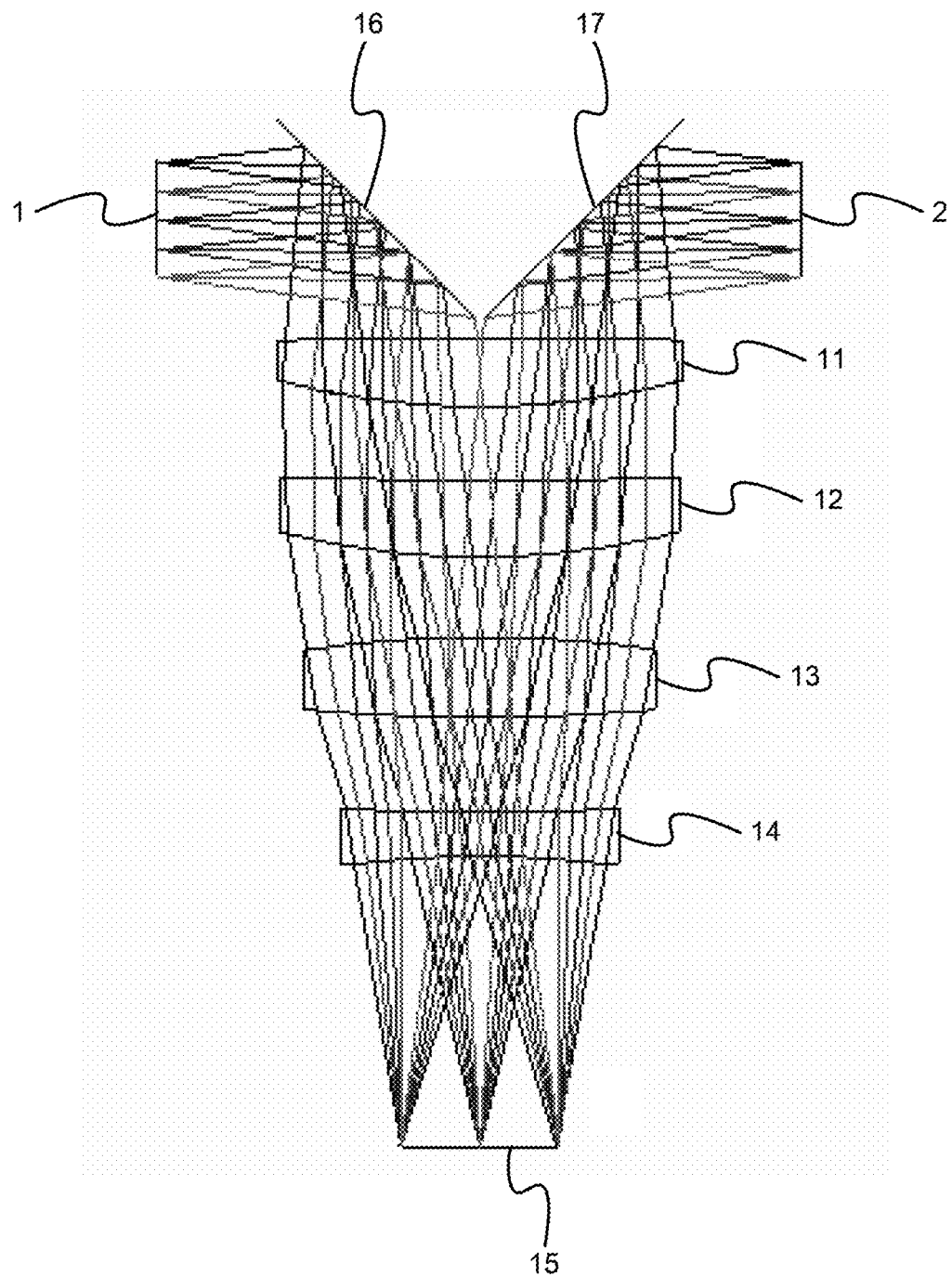
FIG. 1 is a schematic diagram of a cross sectional view of a conjugate common light path lithography lens set according to a first embodiment of the present invention.

Referring to FIG. 1 through FIG. 6, a schematic diagram of a cross sectional view of a conjugate common light path lithography lens set according to a first embodiment of the present invention, a diffraction modulation transfer function curve diagram of the conjugate common light path lithography lens set according to the first embodiment of the present invention; a schematic diagram of a cross sectional view of a conjugate common light path lithography lens set according to a second embodiment of the present invention; a diffraction modulation transfer function curve diagram of the conjugate common light path lithography lens set according to the second embodiment of the present invention, a schematic diagram of a cross sectional view of a conjugate common light path lithography lens set according to a third embodiment of the present invention, a diffraction modulation transfer function curve diagram of the conjugate common light path lithography lens set according to the third embodiment of the present invention, are shown therein.

As shown, the present invention is a conjugate light path lithography lens set, which uses a common optical path to reduce a number of optical components required. The conjugate common light path lithography lens set comprises four spherical lenses 11-14, a spherical reflecting mirror 15, and two planaer reflecting mirrors 16, 17.

The four spherical lenses 11-14 includes a first spherical lens 11, a second spherical lens 12, a third spherical lens 13, and a fourth spherical lens 14. The first, second, and third spherical lenses 11, 12, 13 are each a positive curvature lens, while the fourth spherical lens 14 is a concave lens set and a concaved reflecting mirror.

The first and second spherical lenses 11, 12 each provide a curvature and a calibrated planatism, and the third and fourth spherical lenses 13, 14 are used to calibrate an astigmatism and a curvature of field. Further, the first, second, third, and fourth spherical lenses 11, 12, 13, 14 have their material orders for calibrating a chromatic abberation.

The spherical reflecting mirror 15 is arranged below the fourth spherical lens 14 to reflect the light path and control a mimension of a numerical aperture.

The two planar reflecting mirrors 16, 17 comprises a first planar reflecting mirror 16, and a second planar reflecting mirror 17, which are inclinedly arranged above the first spherical lens 11 to guide a light path. In this manner, a conjugate telecentric component pattern is formed by the spherical lens set, the spherical reflecting mirror, and the first and second planar reflecting mirrors so as to maintain a pattern of an object to have a non-deformed pattern after experiencing the above optical components. As such, the novel conjugate common light path lithography lens set is completed.

The conjugate common light path lithography lens set may be well applicable to a collimated image projection device. In this case, the object is a mask 1. In operation, the mask 1 has its pattern to be outputted on an image forming face 2 through the first planar reflecting mirror 16, the first, second, third and fourth 11, 12, 13, 14, the spherical reflecting mirror 15, the fourth spherical lens 14, the third spherical lens 13, the second spherical lens 12, the first spherical lens 11, and the second planar reflecting mirror 17 sequentially.

The lithography lens set is one of the main assemblies in the lithography set, and used to project a mask onto an image forming face by using its lens, where the optical lens is required to have its resolution up to a diffraction limit and a deformity below 0.01% of a maximum field angle.

Figure 2:
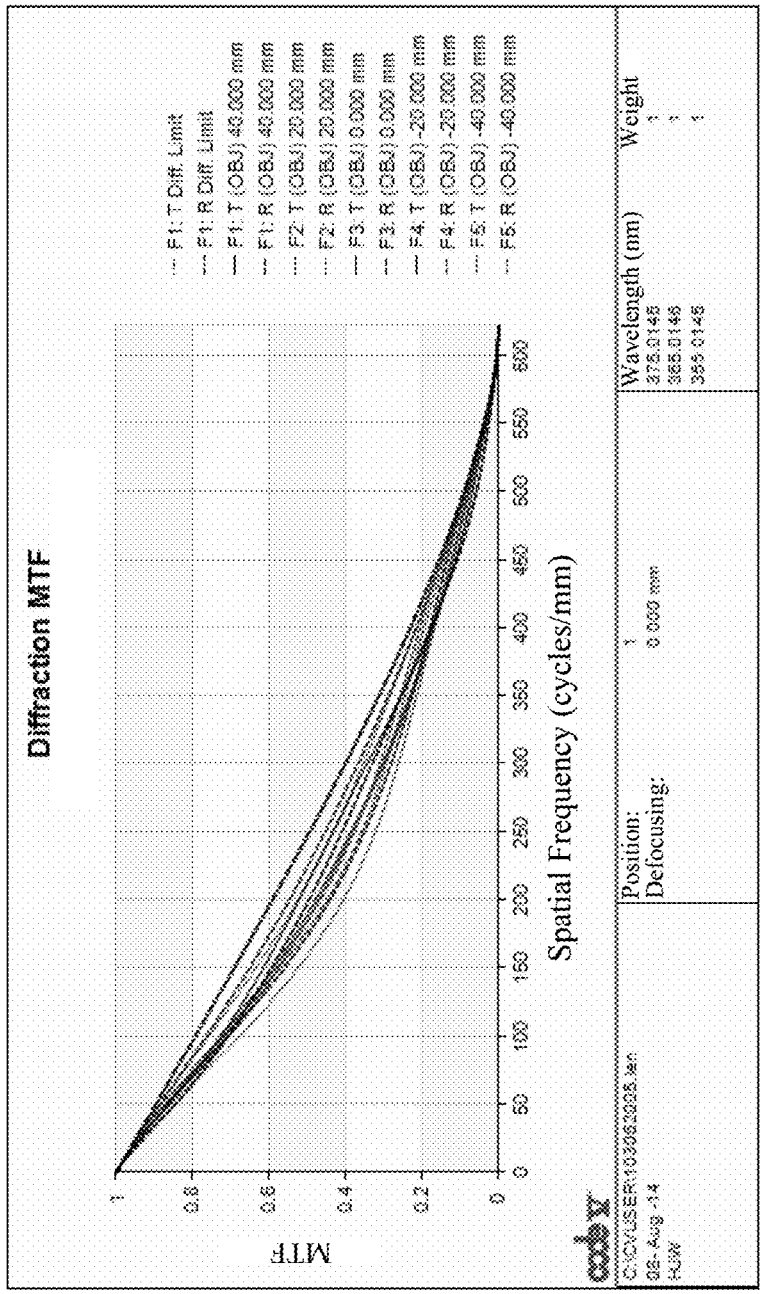
FIG. 2 is a diffraction modulation transfer function curve diagram of the conjugate common light path lithography lens set according to the first embodiment of the present invention.
Figure 3:
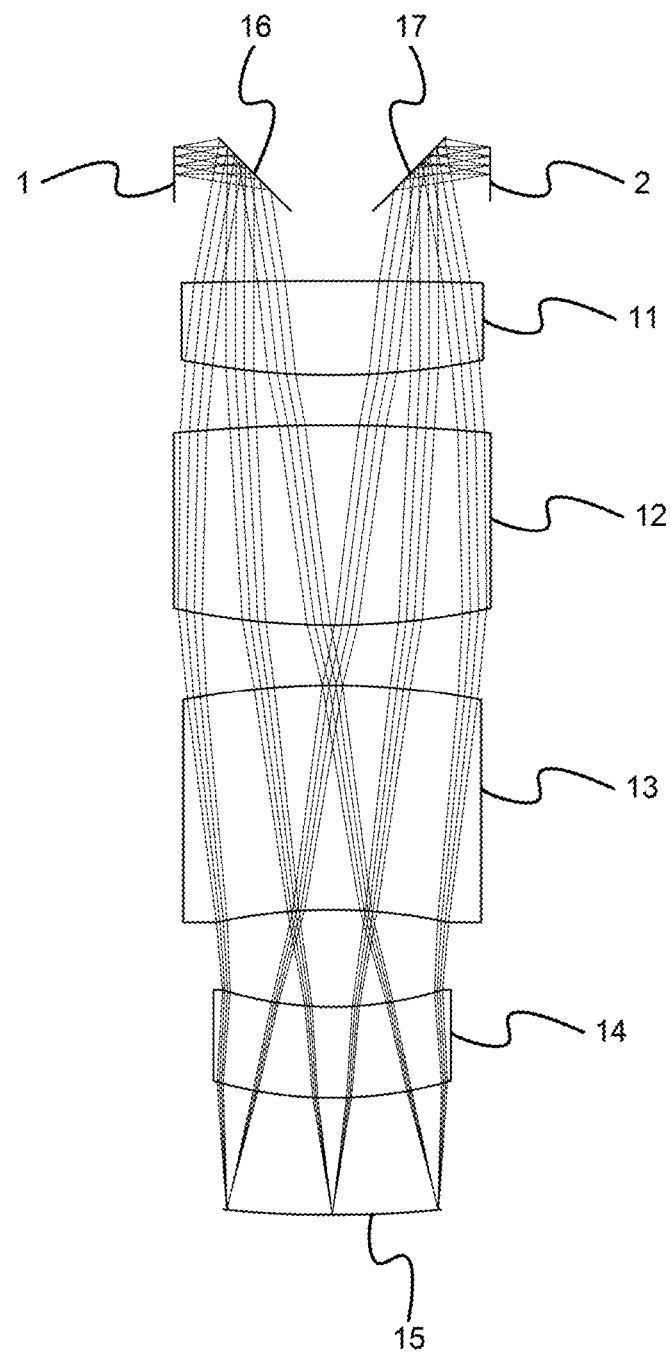
FIG. 3 is a schematic diagram of a cross sectional view of a conjugate common light path lithography lens set according to a second embodiment of the present invention.
Figure 4:
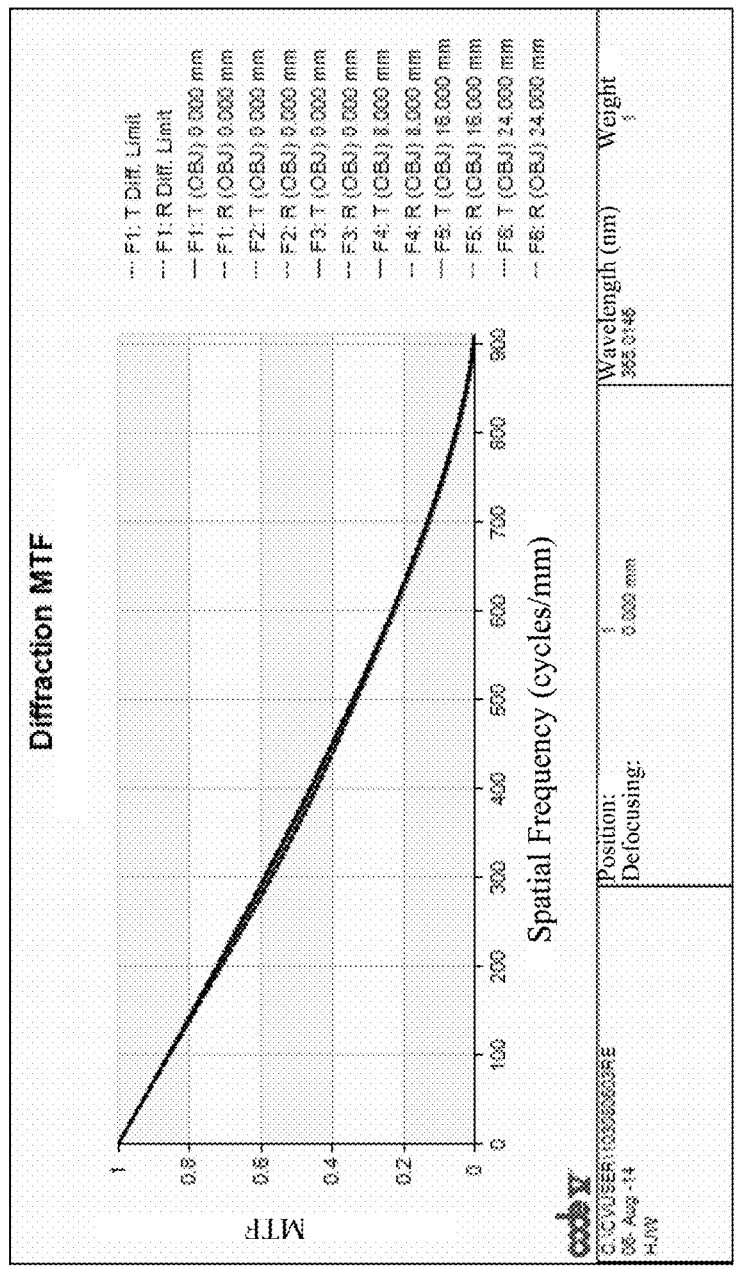
FIG. 4 is a diffraction modulation transfer function curve diagram of the conjugate common light path lithography lens set according to the second embodiment of the present invention.
Figure 5:
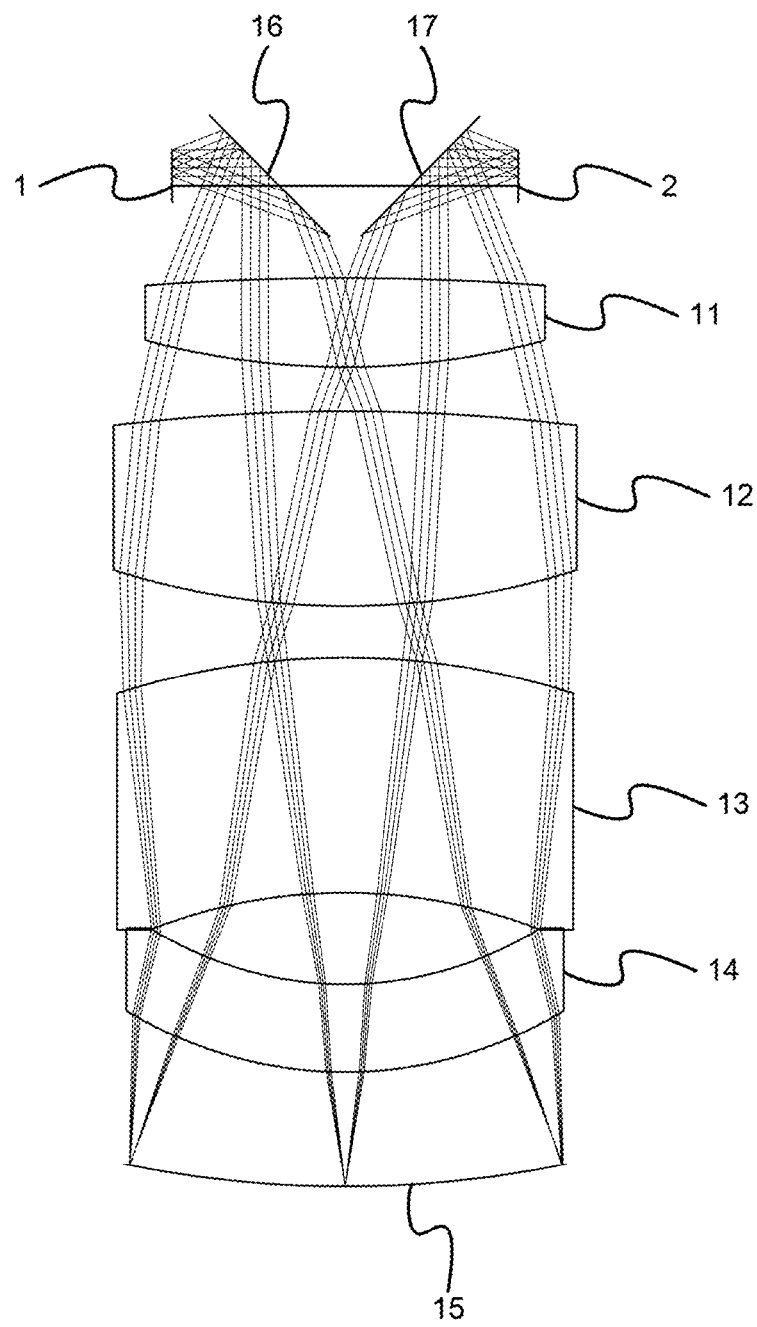
FIG. 5 is a schematic diagram of a cross sectional view of a conjugate common light path lithography lens set according to a third embodiment of the present invention.
Figure 6:
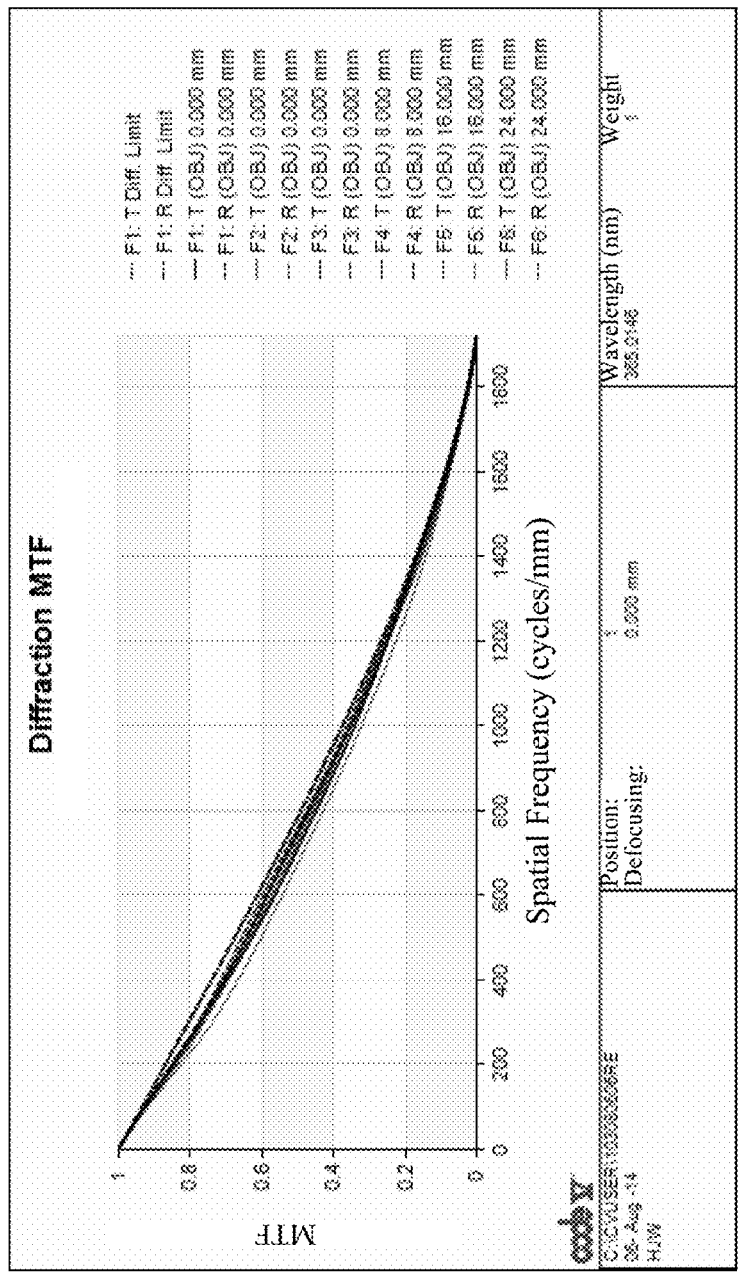
FIG. 6 is a diffraction modulation transfer function curve diagram of the conjugate common light path lithography lens set according to the third embodiment of the present invention.
Figure 7:
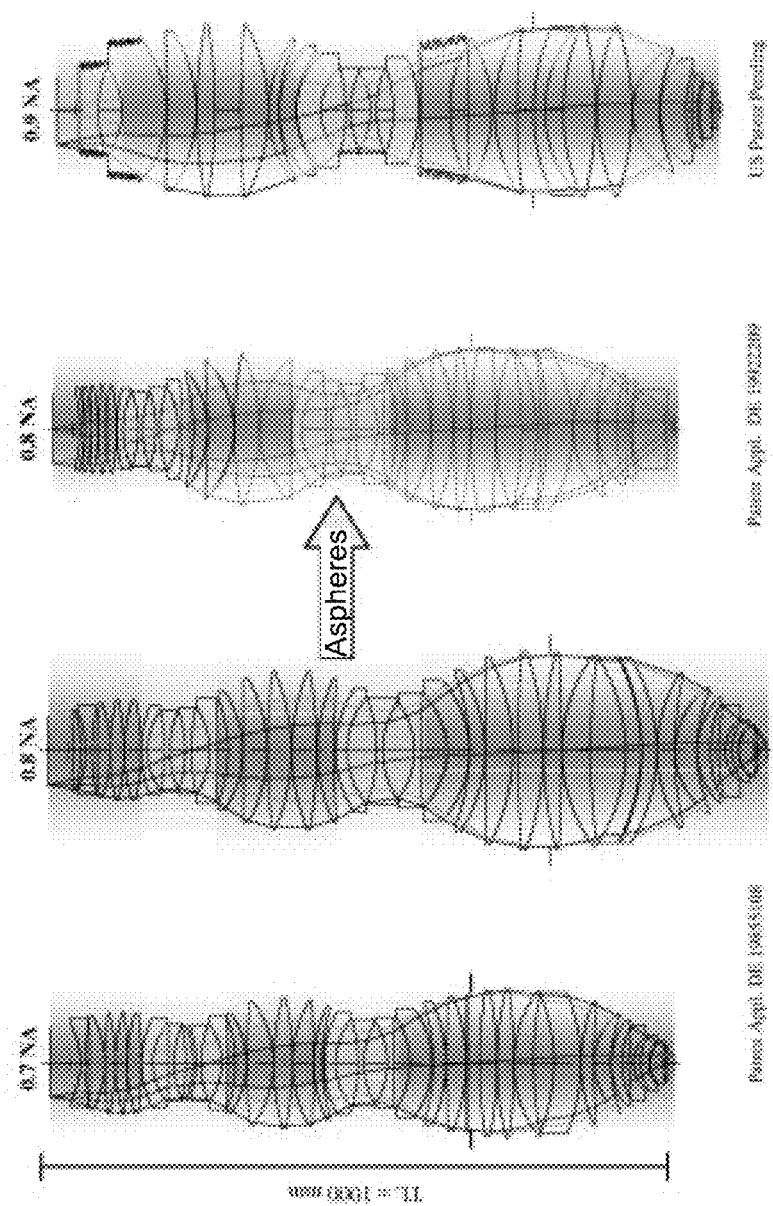
FIG. 7 is a schematic diagram of a cross sectional view of a prior art lithography lens set.
Figure 8:
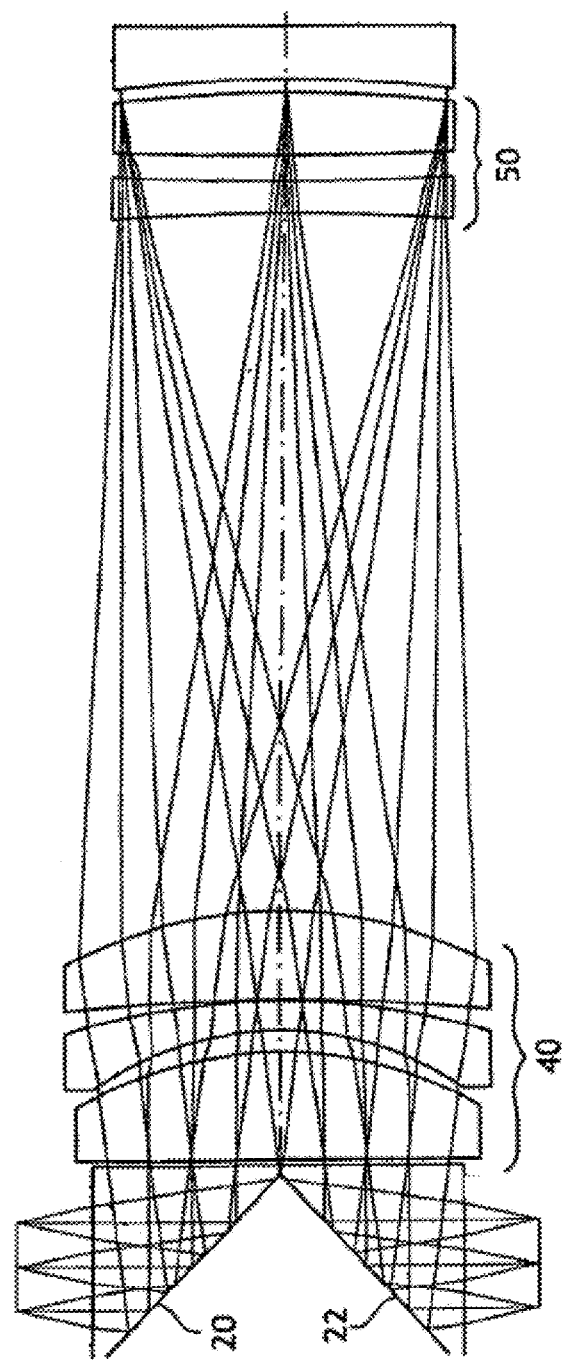
FIG. 8 is a schematic diagram of a cross sectional view of another prior art lithography lens set.

For this, several embodiments are set forth for tests of diffraction modulation transfer functions (MTFs). FIG. 1 and FIG. 2 are a sectional view and the diffraction MTF curve diagram for the conjugate common light path lithography lens set having its numerical aperature of F/4.5, respectively. FIG. 3 and FIG. 4 are a sectional view and the diffraction MTF curve diagram for the conjugate common light path lithography lens set having its numerical aperature of F/3.0, respectively. And, FIG. 5 and FIG. 6 are a sectional view and the diffraction MTF curve diagram for the conjugate common light path lithography lens set having its numerical aperature of F/1.4, respectively.

Viewing from the above results in FIG. 1 to FIG. 6, it may be readily known that the various abberations associated with the lithography lens set in any of the embodiments may be effectively calibrated. The resolutions may reach down to below 5% of the diffraction limit, which is a relatively higher image resolution. In addition, a field domain up to 26 mm×68 mm may be projected.

In this manner, a spherical and folded assembly is adopted, where each of the four spherical lenses and the reflecting mirror all have a spherical surface, and the omni-spherical mirror set and two kinds of optical material are mutually arranged to form the novel conjugate common light path lithography lens set. This may further achieve the function of the lithography lens, and have a direct effect on the manufacturing cost.

In addition, the present invention has the efficacies of reduced component number, easier manufacture of the optical components (satisfied with the lens manufacturing's experience equation), easier calibration, reduced chromatic abberation, optimized aperature F/#, and a reduced cost.

In summary, the present invention is a conjugate common light path lithography lens set, which may effectively improve the demerits encountered in the prior art, the omni-spherical mirror set and two kinds of optical material are mutually arranged to form the novel conjugate common light path lithography lens set. This may further achieve the function of the lithography lens, and have a direct effect on the manufacturing cost. And, the efficacies of reduced component number, easier manufacture of the optical components (satisfied with the lens manufacturing's experience equation), easier calibration, reduced chromatic abberation, optimized aperature F/#, and a reduced cost may be achieved.

From all these views, the present invention may be deemed as being more effective, practical, useful for the consumer's demand, and thus may meet with the requirements for a patent.

The above described is merely examples and preferred embodiments of the present invention, and not exemplified to intend to limit the present invention. Any modifications and changes without departing from the scope of the spirit of the present invention are deemed as within the scope of the present invention. The scope of the present invention is to be interpreted with the scope as defined in the claims.

What is claimed is:

1. A conjugate common light path lithography lens set, comprising:
    a spherical lens set, comprising a first spherical lens, a second spherical positive lens, a third spherical lens, and a fourth spherical lens arranged sequentially, the first and second spherical lenses each providing aplanatism and the third and fourth spherical lens calibrating astigmatism and a curvature of field;
    a spherical reflecting mirror, arranged below the fourth spherical lens, to reflect a light path and control a dimension of a numerical aperture; and
    a first and second planar reflecting mirrors, inclinedly arranged above the first spherical mirror to guide a light path, so that a conjugate telecentric component pattern is formed by the spherical lens set, the spherical reflecting mirror, and the first and second planar reflecting mirrors so as to maintain an pattern of an object to have a non-deformed pattern after experiencing the spherical lens set, the spherical reflecting mirror, and the first and second planar reflecting mirrors.

2. The conjugate common light path lithography lens set as claimed in claim 1, wherein the first, second and third spherical lenses are each a positive curvature lens.

3. The conjugate common light path lithography lens set as claimed in claim 1, wherein the fourth spherical lens is a concave lens.

4. The conjugate common light path lithography lens set as claimed in claim 1, wherein the first, second, third, and fourth spherical lenses are arranged in such an order so that a chromatic aberration is calibrated.

5. The conjugate common light path lithography lens set as claimed in claim 1, wherein the object is a mask.

6. The conjugate common light path lithography lens set as claimed in claim 1, wherein the pattern of the object is outputted after experiencing the first planar reflecting mirror, the first, second, third, fourth spherical lenses, the spherical reflecting mirror, the fourth, third, second and first spherical lenses, and the second planar reflecting mirror.

7. The conjugate common light path lithography lens set as claimed in claim 1, wherein the conjugate common light path lithography lens set is applied to collimated image projection device.

8. The lens set of claim 1, wherein the first, second, third, and fourth lenses are arranged such that gaps exist between the first and second lenses, the second and third lenses, and the third and fourth lenses.

9. The lens set of claim 1, wherein the fourth lens is arranged in contact with the spherical reflecting mirror.

* * * * *